United States Patent [19]

Yu

[11] Patent Number: 5,904,563
[45] Date of Patent: *May 18, 1999

[54] METHOD FOR METAL ALIGNMENT MARK GENERATION

[75] Inventor: Chen-Hua Douglas Yu, Hsin-Chu, Taiwan

[73] Assignee: Taiwan Semiconductor Manufacturing Company, Ltd., Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/650,699

[22] Filed: May 20, 1996

[51] Int. Cl.$^6$ .......................... H01L 23/544; H01L 21/64
[52] U.S. Cl. .......................... 438/672; 438/401; 438/975; 430/22
[58] Field of Search .............................. 430/22; 438/672, 438/975, 401, 462

[56] References Cited

U.S. PATENT DOCUMENTS

| | | | |
|---|---|---|---|
| 5,244,534 | 9/1993 | Yu et al. | 438/672 |
| 5,270,255 | 12/1993 | Wong | 438/643 |
| 5,332,467 | 7/1994 | Sune et al. | 438/633 |
| 5,482,893 | 1/1996 | Okabe et al. | 438/975 |
| 5,503,962 | 4/1996 | Caldwell | 430/317 |

*Primary Examiner*—Janis L. Dote
*Attorney, Agent, or Firm*—George O. Saile; Stephen B. Ackerman

[57] ABSTRACT

The contact hole via mask used in the manufacture of semiconductor integrated circuits is modified to produce a multiplicity of lines and spaces adjacent to the edge of an alignment mark in the via hole pattern. This line-space pattern is etched simultaneously with the contact via holes, and allows the regeneration of the alignment mark after tungsten deposition and planarization of the surface by conventional oxide etching and metallization steps.

13 Claims, 4 Drawing Sheets

METHOD FOR METAL ALIGNMENT MARK GENERATION

FIELD OF THE INVENTION

This invention relates to a method of generation of a metal alignment mark in integrated circuit fabrication, and more particularly to a method for generating an alignment mark which is retained after chemical-mechanical polishing of a tungsten layer. This allows subsequent precision alignment of photolithographic processes required for successful fabrication of integrated circuits.

DESCRIPTION OF PRIOR ART

In the fabrication of semiconductor integrated circuits, patterns of the desired configurations of conductors, insulators and various and sundry other components of the circuit are formed by photolithographic techniques. These techniques employ stencils, known as photomasks, of the patterns which are transferred in a particular order to the circuit under manufacture. A typical integrated circuit may require that as many as a dozen or more such photomasks be employed in its manufacture. It is necessary that the successive photomask applications be accurately aligned to the previous patterns already laid down on the semiconductor substrate. For the purpose of these alignments, a series of alignment marks are provided in each pattern to allow successive photomask patterns to be conveniently and accurately aligned to already-formed circuit component patterns present. As successive layers are built up, it becomes more difficult to locate alignment marks already present in the circuit patterns. It also becomes more difficult to precisely align the currently-employed photomask to previously-fabricated patterns as more and more intervening thicknesses of material are present. Additionally, the alignment mark may be affected by subsequent processing of the pattern in such a fashion as to be deleterious to its function by rendering it more difficult to be observed or by obliterating it altogether. Thus, the alignment capability available for the metallization layer used for via interconnection such as, for example, tungsten relies on the replication of a sharply-defined edge produced at contact via hole etching prior to deposition of tungsten. However, in the conventional processing of tungsten by a chemical-mechanical planarizing of the surface after etching, the edge of the alignment mark is eliminated. In order to provide a means of alignment of subsequent patterns, additional photolithographic steps involving additional photomasks, processing, or both would be required. The use of chemical-mechanical processes for planarization in the fabrication of integrated circuits is described by Sune et al. in U.S. Pat. No. 5,332,467, but the problem of alignment mark alteration or degradation is not discussed. Likewise, the preservation of alignment marks during subsequent processing of aluminum layers is a concern of U.S. Pat. No 5, 270,255 to Wong et al., but neither chemical-mechanical polishing or tungsten layers is specifically addressed.

SUMMARY OF THE INVENTION

A principal object of the present invention is to provide a method for regeneration of photolithographic alignment marks after planarization of tungsten metallization layer by chemical-mechanical polishing. A further object of the invention is to describe a photolithographic pattern modification which preserves alignment capability during conventional integrated circuit manufacturing. In accordance with the objects of this invention, the contact via hole photomask is modified to provide a series of lines and spaces adjacent to the tungsten alignment mark edge which, after etching contact via holes and depositing and planarizing tungsten metal, allow regeneration of alignment marks by conventional oxide etching and metallization steps.

BRIEF DESCRIPTION OF THE DRAWINGS

In the accompanying drawings forming a material part of this description, there is shown.

DESCRIPTION OF THE PREFERRED EMBODIMENT

Figure 1A:
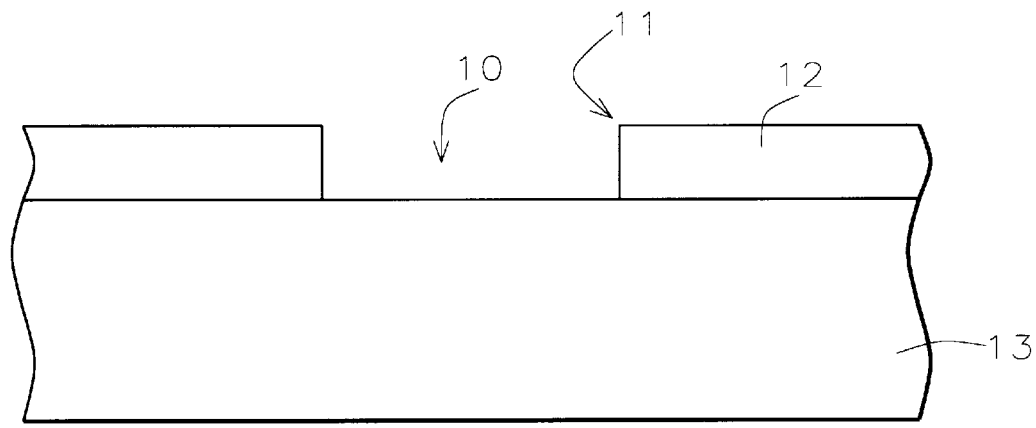
FIG. 1a–1c are schematic cross-sectional drawings of a portion of an integrated circuit fabrication process of the prior art.
Figure 1B:
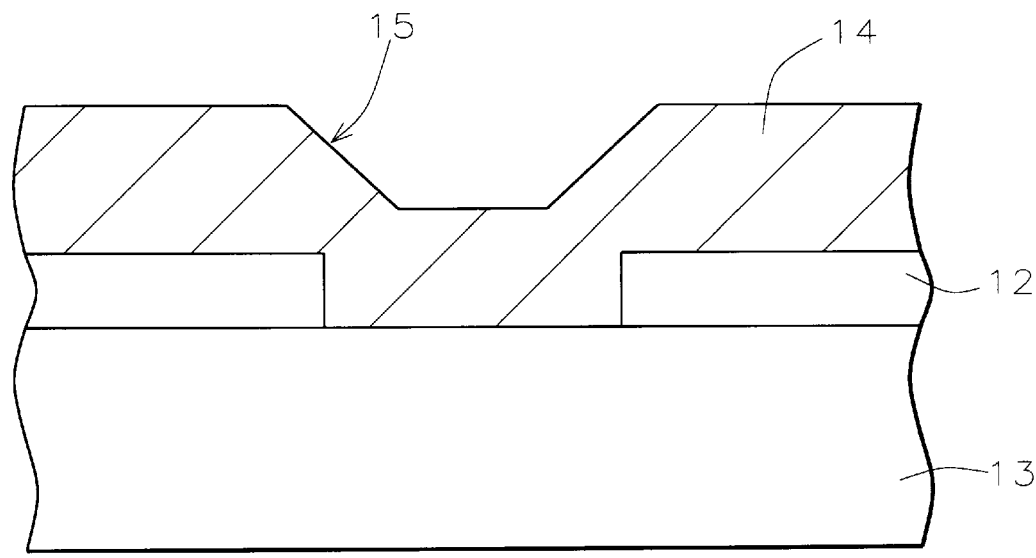
Figure 1C:
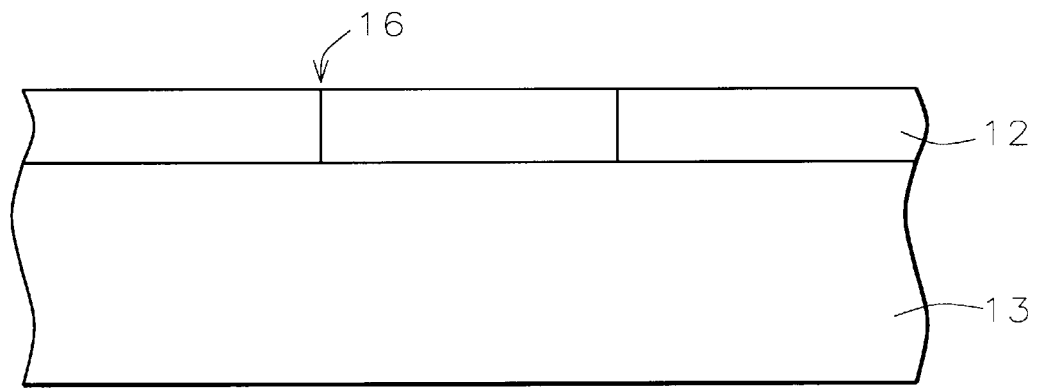
Figure 2A:
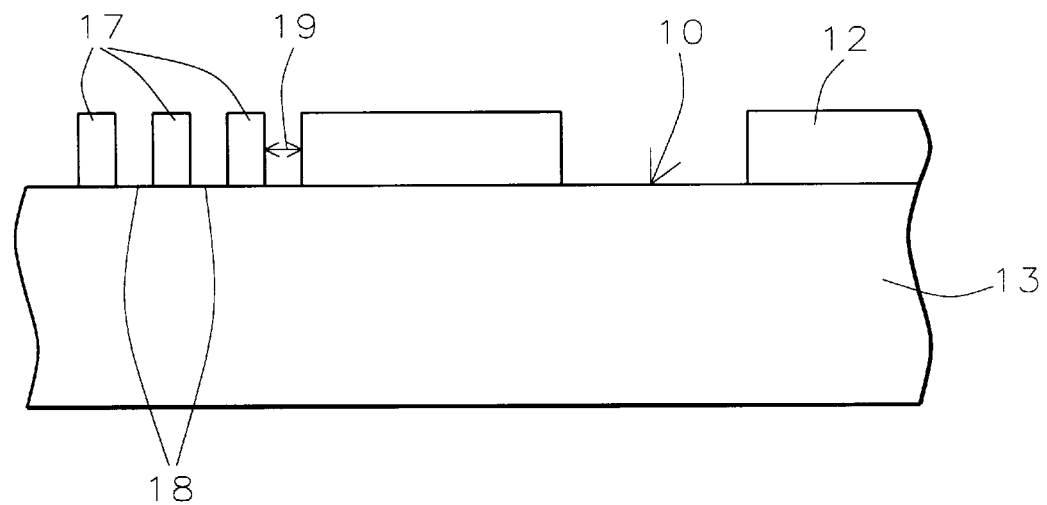
FIG. 2a–2e are schematic cross-sectional drawings of a portion of an integrated circuit fabrication process of the present invention.
Figure 2B:
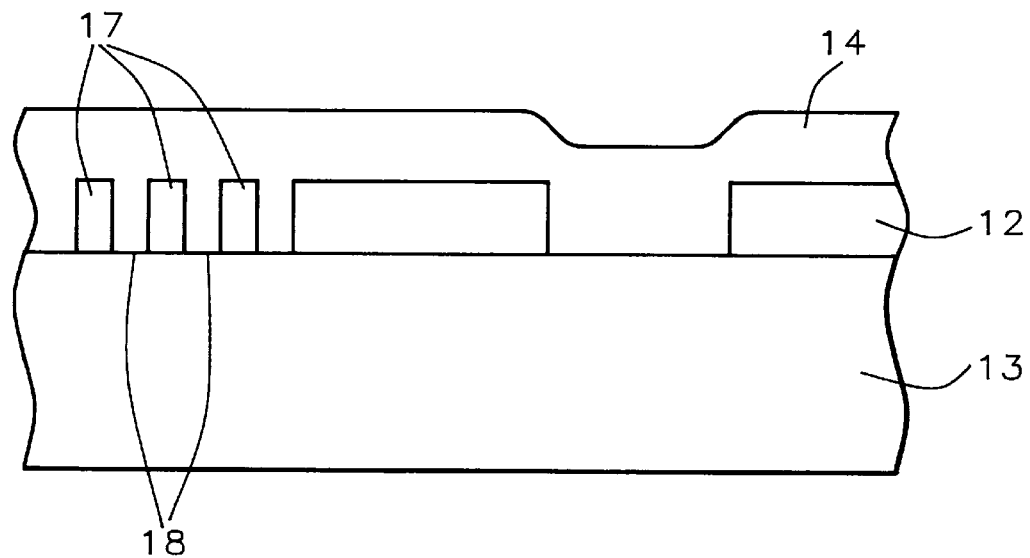
Figure 2C:
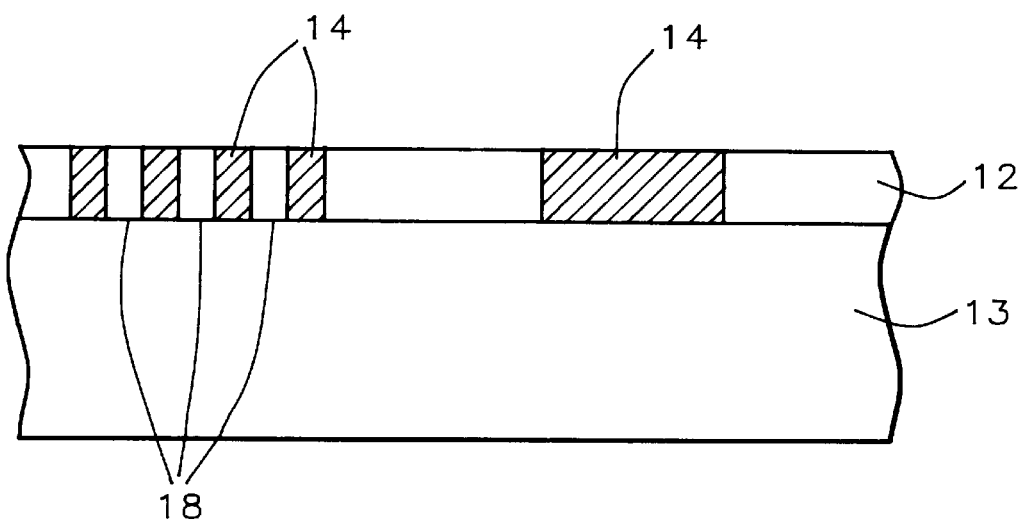
Figure 2D:
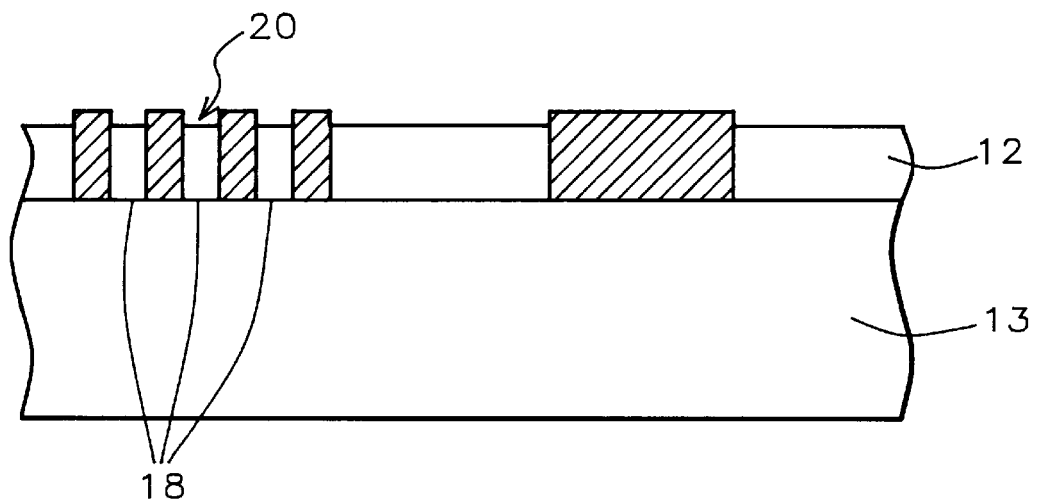
Figure 2E:
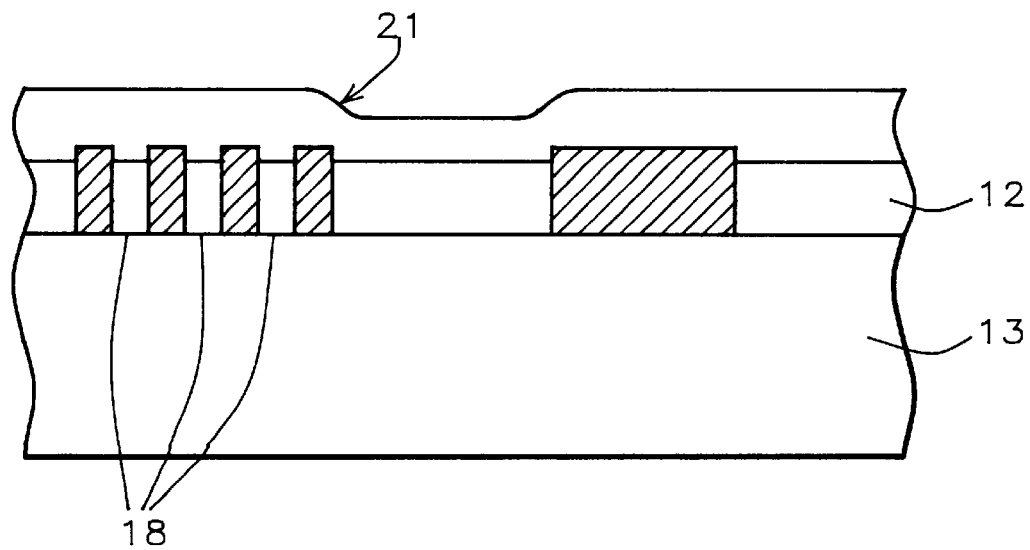

Referring now more particularly to FIG. 1a–1c, there is shown a series of schematic cross-sectional views of a portion of an integrated circuit fabrication sequence of the prior art. In FIG. 1a, a contact via hole 10 is etched through an insulating layer 12, typically of silicon oxide. At the edges 11 of such contact holes or other openings in the oxide layer, such as alignment marks for subsequent photomask pattern alignment to the via hole pattern, sufficient contrast exists at the current step in the process for adequate alignment. The circuit fabrication steps are carried out on a substrate 13 which comprises the original integrated circuit wafer and previous layer or layers to which subsequent layers may make contact. FIG. 1b depicts the deposition of a blanket layer of metal such as, for example, tungsten 14 which replicates the underlying surface topology approximately, such as edges 15. In conventional manufacturing processes for integrated circuits, the tungsten layer is then rendered plane or "planarized" by a process known as chemical-mechanical polishing (CMP). As shown in FIG. 1c, the resulting planar surface no longer possesses an edge sufficient for optical contrast 16 and subsequent attempts to locate or use the feature for alignment of a photomask will fail. The preservation or generation of an alignment mark suitable after CMP processing of tungsten in the prior art requires an additional photomask, photo-lithographic processing, or both, adding complexity and cost to the manufacturing operation, and potentially affecting yield and reliability adversely.

Referring now more particularly to FIG. 2, the method of the present invention will be described in more detail. FIG. 2a shows in addition to the via contact hole openings an additional pattern feature added to one side of any suitable edge which is to be used for pattern alignment, such as adjacent to one edge of an alignment mark. The additional feature consists of a multiplicity of lines 17 spaced by trenches 18 etched in the oxide layer simultaneously with the via contact holes 10. The spacing of the lines by the width of the trenches 19 is kept to be approximately the same as the diameter of the contact or via. The width of the lines should be kept to be less than 50% of the thickness of the conductive layer 21 so that when layer 21 is deposited later on, it is approximately planar over the lines. When the blanket layer of tungsten covers the surface as shown in FIG. 2b, the isolated edges of the underlying oxide pattern are approximately replicated as before, and subsequent CMP planarization processing removes them, also as before. This is shown in FIG. 2c. In order to regenerate a feature with suitable contrast for use as an alignment mark, an oxide etching step, such as by wet or dry etching, is used to remove a sufficient thickness of oxide for this purpose thus creating a step or abrupt height difference between the tungsten and oxide surfaces whereby the tungsten projects above the oxide layer. For example, a commonly-used solution of hydrofluoric acid buffered with chemical agents such as ammonium fluoride (NH4F) and nitric acid (HNO3) can be used to remove the oxide layer in a controlled fashion. This is shown in FIG. 2d, which depicts the etched oxide surface after maskless removal of an oxide thickness 20 of between about 100 and 140 nanometers. The alignment mark feature is then regenerated by blanket deposition, such as by evaporation, of a reflective conductive layer 21 over the surface. The layer is approximately planar over the closely-spaced lines, but produces an edge with sufficient optical contrast where there is no adjacent line, as shown in FIG. 2E. The metallization layer can typically be aluminum, titanium nitride or titanium with a top layer of TiN as an antireflection coating, where the metallization layer has a thickness of between about 3000 and 8000 Angstroms.

The addition of pattern features to an already existing photomask pattern outside any critical feature area does not add to the complexity or cost of the process, and the additional oxide etch step which does not require an etch mask contributes no significant cost or yield detracting features to the integrated circuit manufacturing process. While the invention has been particularly shown and described with reference to the preferred embodiments thereof, it will be understood by those skilled in the art that various changes in form and details may be made without departing from the spirit and scope of the invention.

What is claimed is:

1. A method for regeneration of photolithographic alignment marks after planarization of a metallization layer in integrated circuit manufacturing, comprising the steps of:

forming a line-space pattern in an oxide layer deposited on a substrate, simultaneously with formation of contact or via holes in said oxide layer;

depositing a tungsten layer over said oxide layer, filling said line-space pattern and said contact or via holes;

planarizing said tungsten layer;

etching said oxide layer, whereby said tungsten in said line-space pattern projects above said oxide layer; and depositing a conducting layer over said oxide layer and over said projecting tungsten.

2. The method of claim 1 wherein said planarizing said tungsten layer is accomplished by chemical-mechanical polishing.

3. The method of claim 1 wherein said line-space pattern is formed adjacent to one side of any suitable edge that is to be used for pattern alignment.

4. The method of claim 1 wherein the line-space pattern has a line separation of approximately the same size as the diameter of the via or contact hole.

5. The method of claim 1 wherein the line width of the line-space pattern is less than 50% of the thickness of the conductive layer.

6. The method of claim 1 wherein said etching said oxide layer serves to create a step or abrupt height difference between the tungsten and oxide surfaces by removing between about 100 to 140 nanometers of oxide.

7. A method for regeneration of photolithographic alignment marks removed during tungsten metallization and planarization processes of integrated circuit manufacture, comprising the steps of:

forming a line-space pattern in an oxide layer formed on a substrate, wherein said line-space pattern is adjacent to any suitable edge that is to be used for pattern alignment, simultaneously with formation of contact or via holes in said oxide layer;

depositing a tungsten layer over said oxide layer, filling said line-space pattern and said contact or via holes;

planarizing said tungsten layer;

etching said oxide layer, whereby said tungsten in said line-space pattern projects above said oxide layer; and depositing a conducting layer over said oxide layer and over said projecting tungsten.

8. The method of claim 7 wherein the spacing between lines in the line- space pattern is approximately the same as the diameter of the contact or via hole.

9. The method of claim 7 in which the oxide layer is etched to remove between about 100 and 140 nanometers of oxide.

10. The method of claim 7 in which the oxide etching is accomplished by wet methods of oxide etching.

11. The method of claim 7 in which the oxide etching is accomplished by dry methods of oxide etching.

12. The method of claim 7 wherein said conducting layer is selected from the group consisting of aluminum, titanium nitride, and titanium.

13. The method of claim 7 wherein said conducting layer has a thickness of between about 3000 to 8000 A.

* * * * *